US006268245B1

(12) United States Patent
Wu

(10) Patent No.: US 6,268,245 B1
(45) Date of Patent: Jul. 31, 2001

(54) METHOD FOR FORMING A DRAM CELL WITH A RAGGED POLYSILICON CROWN-SHAPED CAPACITOR

(75) Inventor: Shye-Lin Wu, Hsinchu (TW)

(73) Assignee: Acer Semiconductor Manufacturing Inc., Hsinchu (TW)

(*) Notice: Subject to any disclaimer, the term of this patent is extended or adjusted under 35 U.S.C. 154(b) by 0 days.

(21) Appl. No.: 09/298,927

(22) Filed: Apr. 22, 1999

Related U.S. Application Data

(63) Continuation-in-part of application No. 08/962,623, filed on Nov. 3, 1997, now Pat. No. 5,766,995.

(51) Int. Cl.[7] ........ H01L 21/8242
(52) U.S. Cl. ........ 438/253; 438/398
(58) Field of Search ........ 438/253, 254, 438/255, 258, 396, 398, 691, 745, 756, 757

(56) References Cited

U.S. PATENT DOCUMENTS 5,597,756 * 1/1997 Fazan et al. .......... 437/52
6,037,234 * 3/2000 Hong et al. .......... 438/396

* cited by examiner

*Primary Examiner*—David Nelms
*Assistant Examiner*—Quoc Hoang

(57) ABSTRACT

In the preferred embodiment for forming a ragged polysilicon crown-shaped capacitor of a dynamic random access memory cell, a first dielectric layer is formed on a semiconductor substrate. A portion of the first dielectric layer is removed to define a contact hole within the first dielectric layer, wherein the contact hole is extended down to a source region in the substrate. Next, a conductive plug is formed and communicated to the source region within the contact hole. A second dielectric layer is formed on the first dielectric layer and the conductive plug, and a third dielectric layer is formed on the second dielectric layer. Next, portions of the third dielectric layer and the second dielectric layer are removed to define a storage node opening, wherein the storage node opening is located over the conductive plug. A first conductive layer is then formed to conformably cover the inside surface of the storage node opening and on the third dielectric layer. A fourth dielectric layer is formed on the first conductive layer and the substrate is planarized to the surface of the third dielectric layer. The fourth dielectric layer and the third dielectric layer are then removed to leave a storage node which is composed of the first conductive layer. Finally, a fifth dielectric layer is formed on the storage node, and a second conductive layer is then formed on the fifth dielectric layer to finish the capacitor structure.

19 Claims, 5 Drawing Sheets

134
136
130a
124
120
116
110
120
122b
120
122a
112B
112A
112C
114

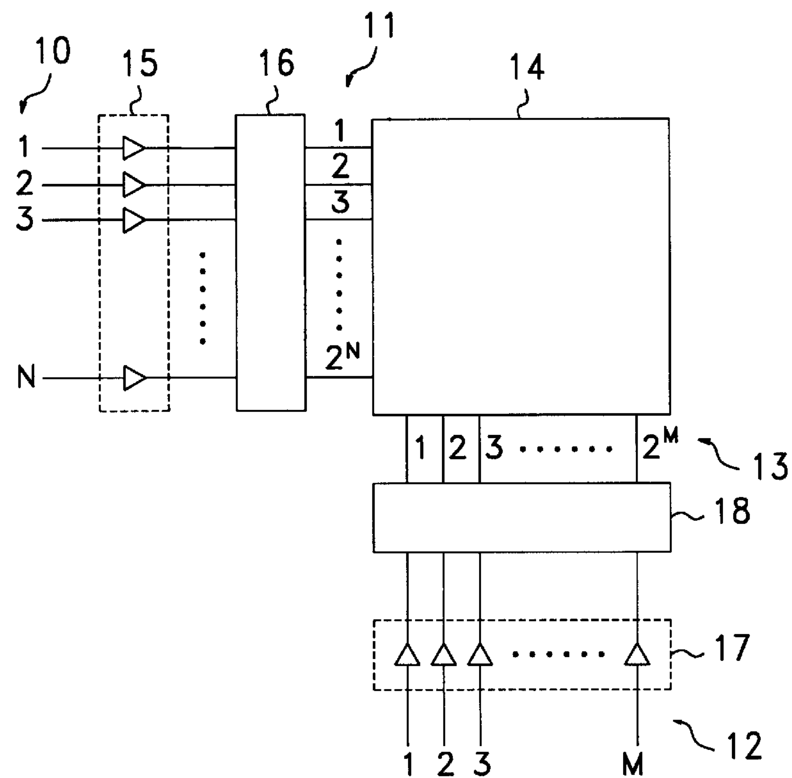
FIG.1
(Prior Art)
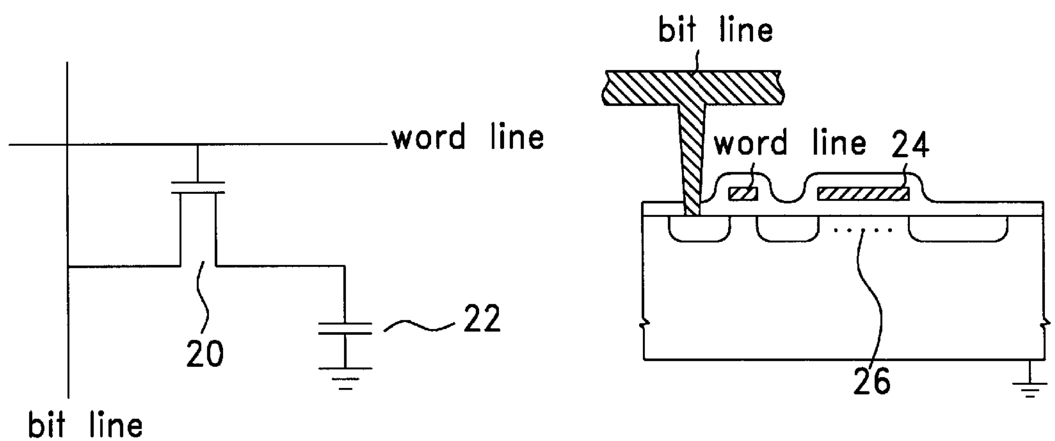
FIG.2A
(Prior Art)
FIG.2B
(Prior Art)

METHOD FOR FORMING A DRAM CELL WITH A RAGGED POLYSILICON CROWN-SHAPED CAPACITOR

CROSS REFERENCE TO RELATED APPLICATIONS

This invention is a continuation-in-part of Ser. No. 08/962,623 filed Nov. 3, 1997 U.S. Pat. No. 5,766,995 by the same inventor entitled "METHOD FOR FORMING A DRAM CELL WITH A RAGGED POLYSILICON CROWN-SHAPED CAPACITOR".

BACKGROUND OF THE INVENTION

1. Field of the Invention

The present invention relates to dynamic random access memory (DRAM) fabrication and more particularly, to a method for forming a ragged polysilicon crown-shaped capacitor of a dynamic random access memory cell.

2. Description of the Prior Art

The increasing popularity of electronic equipment such as computers, for example, is increasing the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flows into and out of the cells via the bit lines 13.

Row address 10 and column address 12 are used to identify a location in the memory 14. A row address buffer 15 and a column address buffer 17, respectively, receive row address 10 signals and column address 12 signals. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due cost to their low cost per bit, high device density and flexibility of use concerning reading and writing operations.

Early DRAMs used storage cells each consisting of three transistors and were manufactured using P-type channel metal-oxide-semiconductor (PMOS) technology. Later, a DRAM storage cell structure consisting of one transistor and one capacitor was developed. A circuit schematic diagram corresponding to this structure is shown in FIG. 2A. The gate of the transistor 20 is controlled by a word line signal and data, represented by the logic level of a capacitor voltage, is written into or read out of the capacitor 22 through a bit line. FIG. 2B shows the cross-section of a traditional one-transistor DRAM storage cell that uses a polysilicon layer 24 as one plate of the capacitor. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor is reduced due to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the storage capacitance while maintaining the small area occupied on the substrate surface. Consequently, this type of capacitor has come to be widely used in DRAM devices.

SUMMARY OF THE INVENTION

In accordance with the present invention, a method is provided for forming a ragged polysilicon crown-shaped capacitor of a dynamic random access memory cell that substantially increases the surface area of the capacitor. In the preferred embodiment, a first dielectric layer is formed on a semiconductor substrate. A portion of the first dielectric layer is removed to define a contact hole within the first dielectric layer, wherein the contact hole is extended down to a source region in the substrate. Next, a conductive plug is formed to be communicated to the source region within the contact hole. A second dielectric layer is formed on the first dielectric layer and the conductive plug, and a third dielectric layer is formed on the second dielectric layer.

Next, portions of the third dielectric layer and the second dielectric layer are removed to define a storage node opening within the third dielectric layer and the second dielectric layer, wherein the storage node opening is located over the conductive plug. A first conductive layer is then formed to conformably cover the inside surface of the storage node opening and on the third dielectric layer. A fourth dielectric layer is formed on the first conductive layer and the substrate is planarized to the surface of the third dielectric layer. The fourth dielectric layer and the third dielectric layer are then removed to leave a storage node which is composed of the first conductive layer. Finally, a fifth dielectric layer is formed on the storage node, and a second conductive layer is then formed on the fifth dielectric layer to finish the capacitor structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a simplified diagram illustrative of the organization of a typical large semiconductor memory;

FIG. 2A shows a circuit schematic diagram of a typical one-transistor dynamic random access memory (DRAM) cell;

FIG. 2B shows a cross-sectional view illustrative of traditional one-transistor DRAM storage cell;

DESCRIPTION OF THE PREFERRED EMBODIMENT

Figure 3:
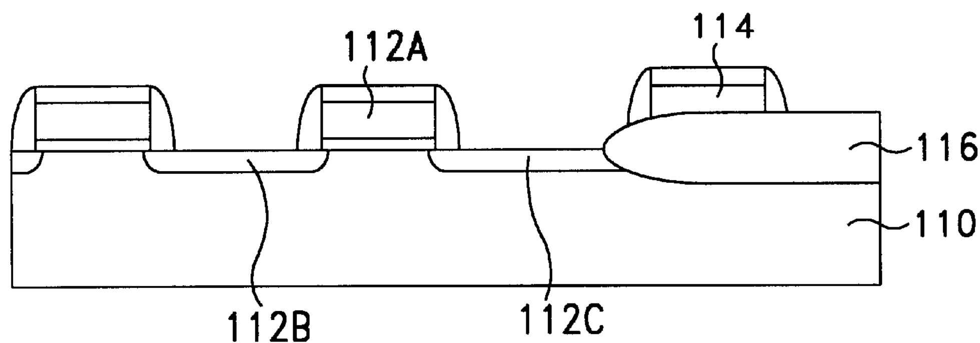
FIG. 3 shows a cross-sectional view illustrative of a semiconductor substrate having transistors thereon for forming DRAM capacitors in accordance with the present invention.

Referring to FIG. 3, a metal-oxide-semiconductor field effect transistor (MOSFET) having a gate 112A, a drain 112B and a source 112C, is conventionally formed in and on the substrate 110. A field oxide (FOX) region 116 is conventionally formed in the substrate 110 adjacent to the MOSFET for isolation purposes. Further, a word line 114 is formed on the FOX region 116. In this embodiment, the MOSFET is an n-channel MOSFET that forms part of a DRAM cell.

Figure 4:
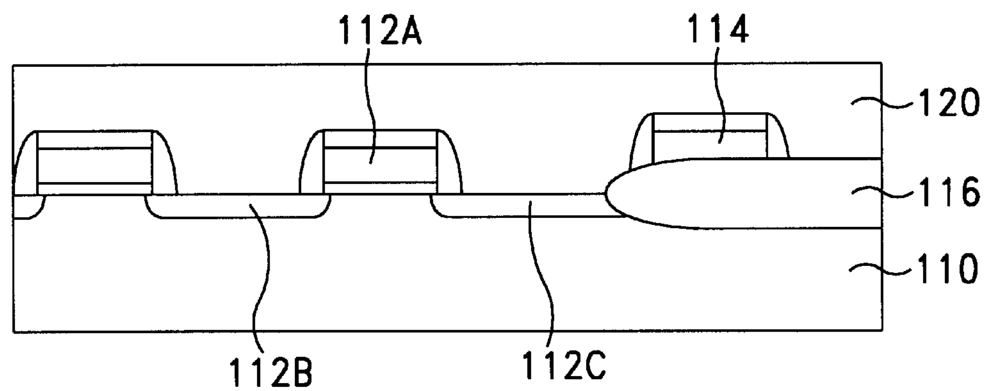
FIG. 4 shows a cross-sectional view illustrative of forming a first dielectric layer on the semiconductor substrate in accordance with the present invention.

Next, a first dielectric layer 120, such as an undoped oxide layer, a doped silicon oxide layer or a boro-phosphosilicate glass (BPSG) layer, is deposited over the substrate 110 and the structure of FIG. 3, in order to serve as the main insulation layer between conductive layers or conductive regions. The first dielectric layer 120 is typically deposited with a conventional low pressure chemical vapor deposition (LPCVD) or plasma enhanced chemical vapor deposition (PECVD) process as shown in FIG. 4. The thickness of this silicon oxide layer 120 ranges from about 3000 to 6000 angstroms. After the silicon oxide layer 120 is deposited, it can then be planarized using any suitable conventional method such as an etch back process or a chemical mechanical polishing (CMP) process.

Figure 5:
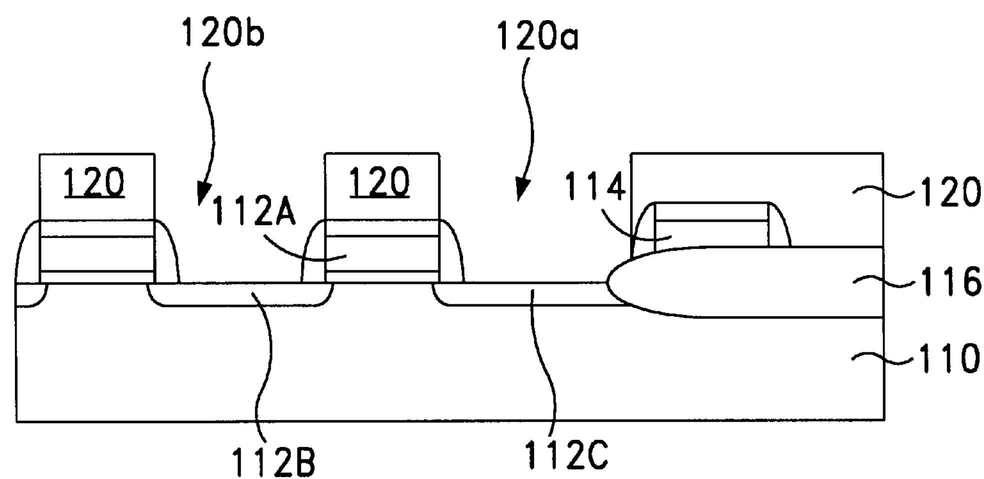
FIG. 5 shows a cross-sectional view illustrative of removing a portion of the first dielectric layer to define a contact hole in accordance with the present invention.

Referring to FIG. 5, a process of removing a portion of the first dielectric layer 120 is performed to define a contact hole 120*a* within the first dielectric layer 120, and make the contact hole 120 be extended down to a source region 112*c* in the substrate 110. A typical process including lithography and an etching approach is employed to define the contact hole 120*a*. In the preferred embodiments, a bit line contact hole 120*b* is defined simultaneously with the contact hole 120*a* for a storage node.

Figure 6:
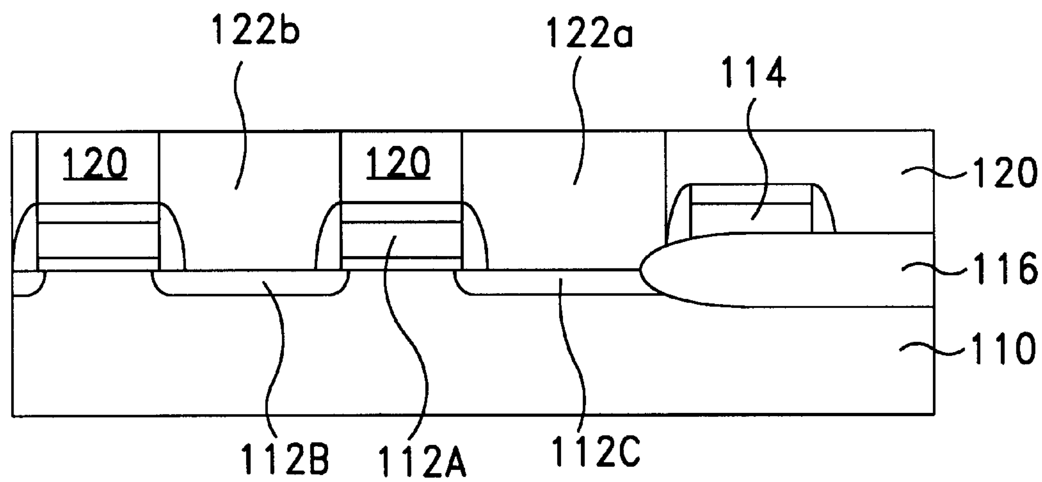
FIG. 6 shows a cross-sectional view illustrative of forming a conductive plug within the contact hole in accordance with the present invention.

Turning to FIG. 6, a conductive plug 122*a* is formed and also communicated to the source region 112*c* within the contact hole 120*a*. The conductive plug 122*a* is preferably a polysilicon plug, which is formed by depositing and etching-back a polysilicon layer. Another conductive plug 122*b* is formed within the bit line contact hole 120*b* at the same time.

Figure 7:
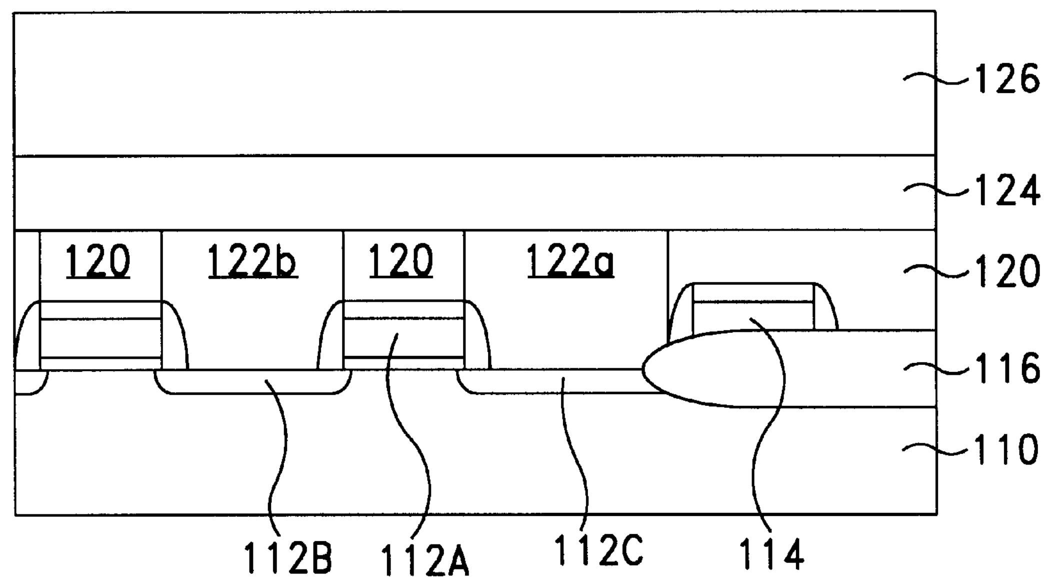
FIG. 7 shows a cross-sectional view illustrative of forming a second dielectric layer and a third dielectric layer in accordance with the present invention.

Referring to FIG. 7, a second dielectric layer 124 is then formed on the first dielectric layer 120 and the conductive plugs 122*a* and 122*b*. In the preferred embodiments, a silicon oxide layer is employed as the second dielectric layer 124, and the silicon oxide layer is preferably deposited with a conventional chemical vapor deposition technique like low pressure chemical vapor deposition (LPCVD) or plasma enhanced chemical vapor deposition (PECVD) process. The thickness of the silicon oxide layer 124 is between about 1000 to 3000 angstroms in this case.

Further, a third dielectric layer 126 of silicon nitride is subsequently formed on the second dielectric layer 124. In this embodiment, the silicon nitride layer 126 is deposited using a conventional low pressure chemical vapor deposition (LPCVD) or plasma enhanced chemical vapor deposition (PECVD). The thickness of the silicon nitride layer 126 is about 5000 to 10000 angstroms, in order to provide a recessed space for forming a storage node therein.

Figure 8:
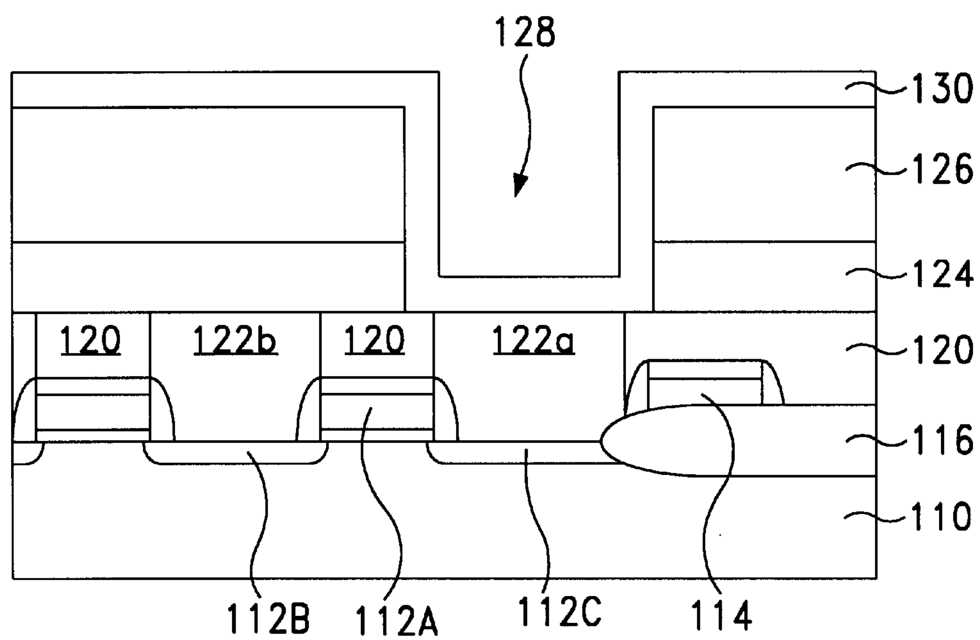
FIG. 8 shows a cross-sectional view illustrative of removing portions of the third dielectric layer and the second dielectric layer to define a storage node opening, and forming a first conductive layer therein, in accordance with the present invention.

Next, a series of steps are carried out to remove portions of the third dielectric layer 126 and the second dielectric layer 124 to define a storage node opening 128 within the third dielectric layer 126 and the second dielectric layer 124, as shown in FIG. 8. For communicating the bottom electrode of the capacitor, the storage node opening 128 is located over the conductive plug 122*a*. The steps for forming the storage node opening 128 typically include the lithography process and a following etch step.

A first conductive layer 130 is formed to conformably cover the surfaces inside the storage node opening 128 and also cover the third dielectric layer 126. In the preferred embodiments, the first conductive layer 130 is a doped polysilicon layer, for example, using a standard chemical vapor deposition process with in-situ doped n-type dopants, in order to serve as the bottom electrode of the capacitor. In the preferred embodiments, the thickness of the first conductive layer 130 is between about 500 to 3000 angstroms.

Figure 9:
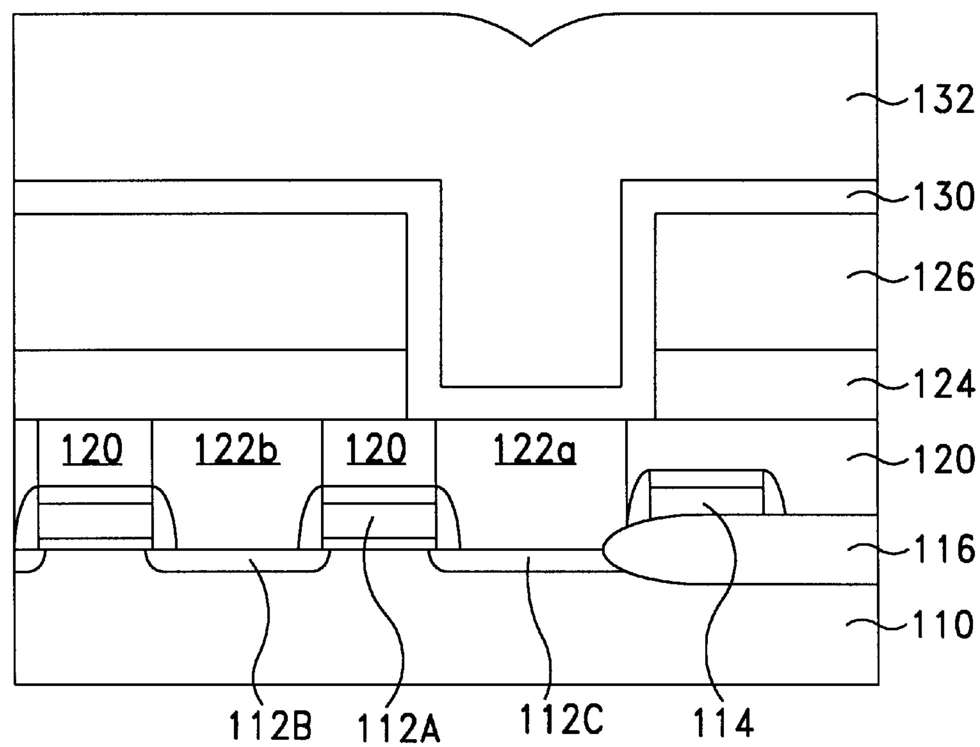
FIG. 9 shows a cross-sectional view illustrative of forming a fourth dielectric layer on the first conductive layer in accordance with the present invention.

Referring to FIG. 9, a fourth dielectric layer 132 is then deposited on the first conductive layer 130. In this case, a thick silicon nitride layer is formed as the fourth dielectric layer 132, in a manner of totally filling up the space inside the recessed region within the first conductive layer 130. As an example, the thickness of the fourth dielectric layer 132 is about 4000 to 9000 angstroms. In addition to silicon nitride, other alternative materials, such as silicon oxide or photoresist, can also be utilized as the fourth dielectric layer 132 to fill over the first conductive layer 130.

A planarizing step is performed to the substrate 110, preferably down to the surface of the third dielectric layer 126 for removing portions of the first conductive layer 130 and defining individual bottom electrodes. As an example, a chemical-mechanical polishing (CMP) process is utilized for planarizing the top surface of the substrate 110.

Figure 10:
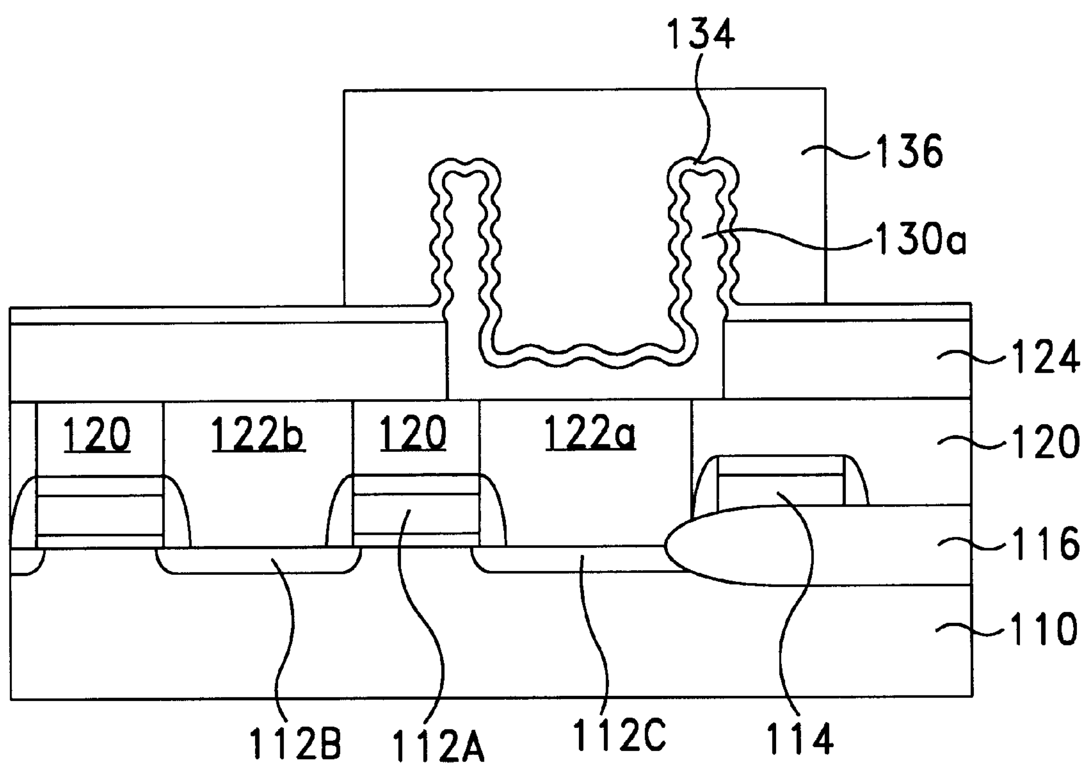
FIG. 10 shows a cross-sectional view illustrative of removing the fourth dielectric layer and the third dielectric layer, and forming a fifth dielectric layer and a second conductive layer to form a capacitor in accordance with the present invention.

Turning to FIG. 10, the fourth dielectric layer 132 and the third dielectric layer 126 remaining after the planarizing step are then removed to leave a storage node 130*a,* which is composed of the first conductive layer 130. Having the fourth dielectric layer 132 and the third dielectric layer 126 of silicon nitride in this case, a wet etch using hot phosphoric solution is carried out to remove silicon nitride and also to remove part of the surface portion of the first conductive layer 130 to roughen the storage node surface to a ragged surface as shown in the figure. In this embodiment, the composition of the phosphoric acid solution ($H_3PO_4$) is preferably about 86+/−1% $H_3PO_4$ and 14+/−1% $H_2O$. The temperature used in the embodiment is preferably about 150–170° C., and can range between about 140° C. to 180° C. If silicon oxide or photoresist are employed alternatively as the fourth dielectric layer 132, an appropriate removing step can be performed prior to the application of the wet etch using hot phosphoric solution.

Referring to FIG. 10, a fifth dielectric film 134 and a second conductive layer 136 for a top electrode of the DRAM cell capacitor are then formed in the conventional manner. In this embodiment, a thin dielectric layer 134, such as stacked oxide-nitride-oxide (ONO) film, is formed on the exposed surface of the bottom electrode 130*a* and the surface of the second dielectric layer 124. As is known in the art of DRAM fabrication, the ONO film is reliable over silicon surfaces, and is typically used as a capacitor insulator. The ultra-thin bottom oxide layer of the stacked oxide-nitride-oxide (ONO) film 134 is formed by thermally oxidizing the polysilicon surface, then an LPCVD silicon nitride layer is deposited followed by oxidizing the silicon nitride layer to form the top oxide layer. Other material, such as NO, $Ta_2O_5$, $TiO_2$, PZT, or BST can be used as the thin dielectric layer 134. A second conductive layer 136 is then deposited over the stacked oxide/silicon nitride/oxide layer 134 to serve as an upper plate of the DRAM cell capacitor, thereby forming a dynamic random access memory cell with a ragged polysilicon crown-shaped capacitor. Typically, the second conductive layer 136 is a doped polysilicon layer formed in the same manner as the polysilicon layer 130. Other material, such as metal or silicide, can be used as the conductive layer 136.

Although specific embodiments have been illustrated and described, it will be obvious to those skilled in the art that various modifications may be made without departing from the spirit which is intended to be limited solely by the appended claims.

What is claimed is:

1. A method for forming a capacitor, said method comprising the steps of:

forming a first dielectric layer on a semiconductor substrate;

removing a portion of said first dielectric layer to define a contact hole within said first dielectric layer, said contact hole being extended down to a source region in said substrate;

forming a conductive plug being communicated to said source region within said contact hole;

forming a second dielectric layer on said first dielectric layer and said conductive plug;

forming a third dielectric layer on said second dielectric layer;

removing portions of said third dielectric layer and said second dielectric layer to define a storage node opening within said third dielectric layer and said second dielectric layer, said storage node opening being located over said conductive plug;

forming a first conductive layer covering conformably the inside surface of said storage node opening and on said third dielectric layer;

forming a fourth dielectric layer on said first conductive layer;

planarizing said substrate to the surface of said third dielectric layer;

removing said fourth dielectric layer and said third dielectric layer;

thinning and simultaneously roughening said first conductive layer, thereby forming a storage node composed of said first conductive layer;

forming a fifth dielectric layer on said storage node; and forming a second conductive layer on said the dielectric layer.

2. The method according to claim 1, wherein said first dielectric layer comprises silicon oxide.

3. The method according to claim 1, wherein said second dielectric layer comprises silicon oxide.

4. The method according to claim 1, wherein said third dielectric layer comprises silicon nitride.

5. The method according to claim 1, wherein said fourth dielectric layer comprises silicon nitride.

6. The method according to claim 1, wherein said fifth dielectric layer comprises a material selected from the group consisted of stacked oxide-nitride-oxide (ONO) film, NO, $Ta_2O_5$, $TiO_2$, PZT, and BST.

7. The method according to claim 1, wherein said conductive plug comprises polysilicon.

8. The method according to claim 1, wherein said first conductive layer comprises doped polysilicon layer.

9. The method according to claim 1, wherein said first conductive layer is thinned and simultaneously roughened by performing a wet etching process.

10. The method according to claim 9, wherein said first conductive layer is roughened with hot phosphoric acid solution.

11. A method for forming a capacitor, said method comprising the steps of:

forming a first dielectric layer on a semiconductor substrate;

removing a portion of said first dielectric layer to define a contact hole within said first dielectric layer, said contact hole being extended down to a source region in said substrate;

forming a conductive plug being communicated to said source region within said contact hole;

forming a second dielectric layer on said first dielectric layer and said conductive plug;

forming a third dielectric layer on said second dielectric layer;

removing portions of said third dielectric layer and said second dielectric layer to define a storage node opening within said third dielectric layer and said second dielectric layer, said storage node opening being located over said conductive plug;

forming a first conductive layer covering conformably the inside surface of said storage node opening and on said third dielectric layer;

forming a fourth dielectric layer on said first conductive layer;

planarizing said substrate to the surface of said third dielectric layer, whereby said first conductive layer has a surface;

performing a wet etch to remove said fourth dielectric layer and said third dielectric layer, to thin said first conductive layer, and to roughen the surface of said first conductive layer, thereby forming a storage node composed of said first conductive layer;

forming a fifth dielectric layer on said storage node; and forming a second conductive layer on said fifth dielectric layer.

12. The method according to claim 11, wherein said first dielectric layer comprises silicon oxide.

13. The method according to claim 11, wherein said second dielectric layer comprises silicon oxide.

14. The method according to claim 11, wherein said third dielectric layer comprises silicon nitride.

15. The method according to claim 11, wherein said fourth dielectric layer comprises silicon nitride.

16. The method according to claim 11, wherein said fifth dielectric layer comprises a material selected from the group consisted of stacked oxide-nitride-oxide (ONO) film, NO, $Ta_2O_5$, $TiO_2$, PZT, and BST.

17. The method according to claim 11, wherein said conductive plug comprises polysilicon.

18. The method according to claim 11, wherein said first conductive layer comprises doped polysilicon layer.

19. The method according to claim 11, wherein said first conductive layer is roughened with hot phosphoric acid solution.

* * * * *